United States Patent [19]

Nomiya et al.

[11] 4,074,262

[45] Feb. 14, 1978

[54] KEY INPUT CIRCUIT

[75] Inventors: Kosei Nomiya, Tokyo; Shinkichi Hotta, Kodaira, both of Japan

[73] Assignee: Hitachi, Ltd., Japan

[21] Appl. No.: 652,661

[22] Filed: Jan. 27, 1976

[30] Foreign Application Priority Data

Jan. 31, 1975 Japan .................................. 50-12583

[51] Int. Cl.$^2$ .............................................. G06F 3/02
[52] U.S. Cl. ............................... 340/365 S; 178/17 C
[58] Field of Search ............ 340/365 R, 365 S, 365 E; 200/5 A; 178/17 C

[56] References Cited

U.S. PATENT DOCUMENTS

| | | | |
|---|---|---|---|
| 3,662,378 | 5/1972 | Mac Arthur | 340/365 S |
| 3,675,239 | 7/1972 | Ackerman et al. | 340/365 S |
| 3,683,371 | 8/1972 | Holz | 340/365 S |
| 3,717,871 | 2/1973 | Hatano et al. | 340/365 S |
| 3,721,976 | 3/1973 | Kuijsten | 340/365 S |
| 3,750,113 | 7/1973 | Cencel | 340/365 S |
| 3,764,791 | 10/1973 | Kashio | 340/365 S |
| 3,950,743 | 4/1976 | Hatano et al. | 340/365 S |

Primary Examiner—Donald J. Yusko
Assistant Examiner—James J. Groody
Attorney, Agent, or Firm—Craig & Antonelli

[57] ABSTRACT

A key input circuit includes a binary-coded N-ary counter consisting of a plurality of binary counters, a decoder decoding coded pulse outputs of the counter for converting the counter outputs into a plurality of timing pulse signals, which are applied respectively to a plurality of keys. These timing pulse signals form a key information input by manipulation of the corresponding key, and a plurality of gates are provided for coding the key information by gating the input provided by the specific coded pulse output of the counter in response to receipt of the control input provided by the specific key signal applied through the manipulated key.

15 Claims, 11 Drawing Figures

F I G. 6a
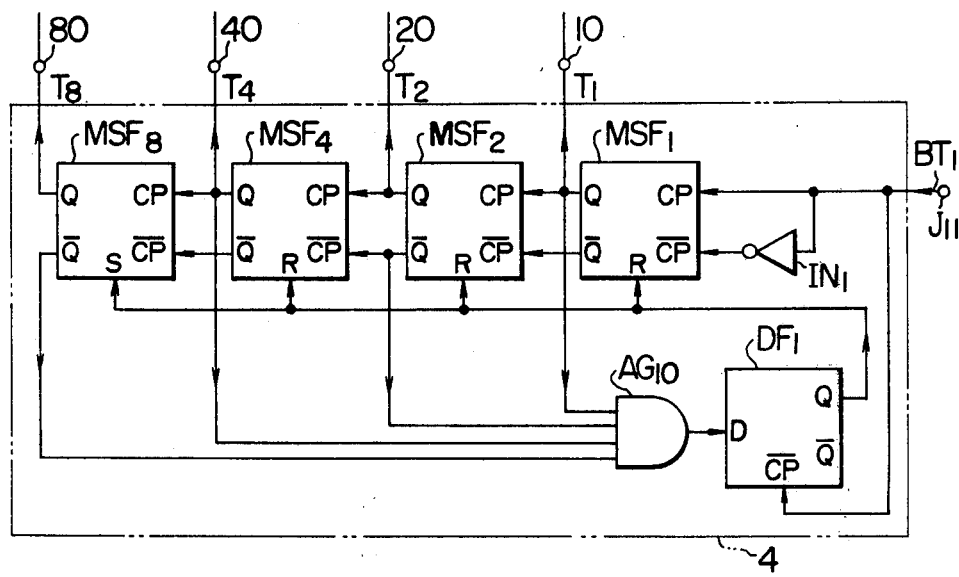
F I G. 6b
TRUTH TABLE FOR MSF$_1$-MSF$_8$
| CP | Q$_{n+1}$ |
|---|---|
| 0 | Q$_n$ |
| 1 | $\overline{Q_n}$ |

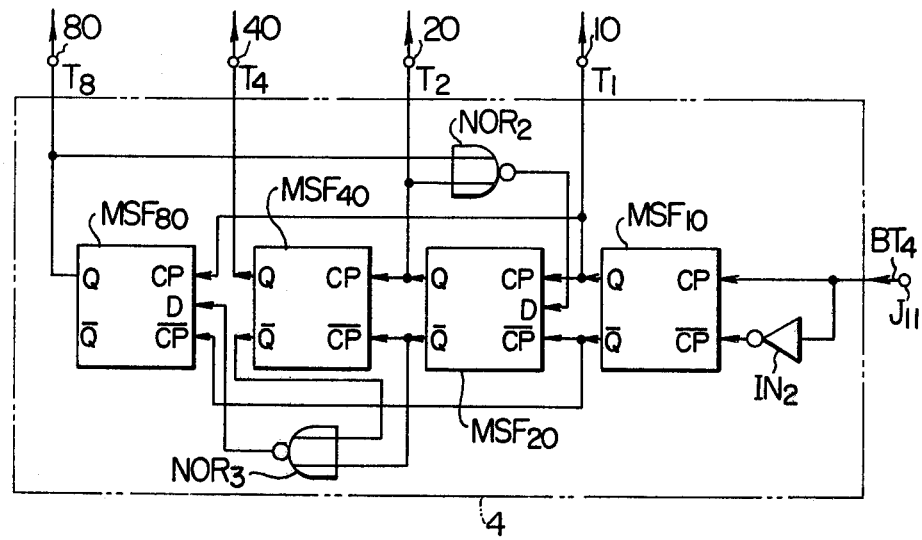
FIG. 7a
FIG. 7b
TRUTH TABLE FOR MSF$_{20}$, MSF$_{80}$
| CP | 0 | 1 | 0 | 1 |
|---|---|---|---|---|
| D | 0 | 0 | 1 | 1 |
| Q$_{n+1}$ | 0 | Q$_n$ | 1 | Q$_n$ |
FIG. 7c
TRUTH TABLE FOR MSF$_{10}$, MSF$_{40}$
| CP | 0 | 1 |
|---|---|---|
| Q$_{n+1}$ | $\overline{Q_n}$ | Q$_n$ |
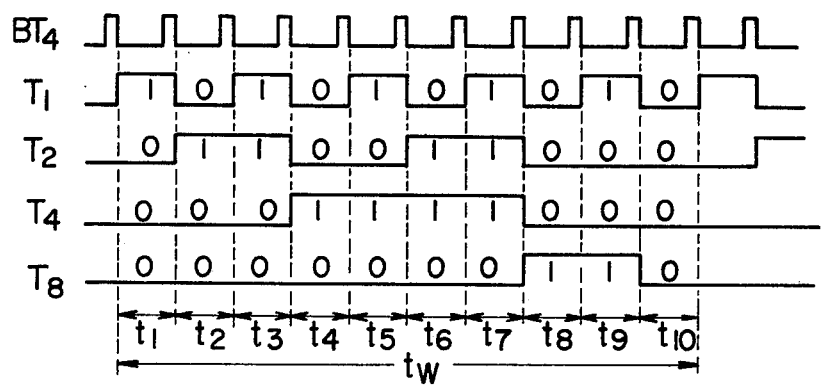
FIG. 8

KEY INPUT CIRCUIT

This invention relates to a key input circuit for use in digital electronic apparatus such as desk computers.

A key input circuit is used to apply inputs to a digital electronic apparatus such as a desk computer or electronic typewriter, and comprises generally a plurality of push button switches. These push button switches or keys are selectively and successively manipulated for applying desired key information inputs to the electronic apparatus.

Signal processing means such as memory means, arithmetic means and control means, which are principal parts of an electronic apparatus, for example, a desk computer, are constructed in semiconductor integrated circuit form, but a key input circuit for use in such electronic apparatus must be disposed externally independent of the signal processing system due to the limitation of the present technique of making semiconductor integrated circuits. In a prior art key input circuit, therefore, it has been essentially necessary to provide many input terminals for application of signals to such signal processing means of semiconductor integrated circuit structure, and difficulty has thus been encountered to realize the construction in which substantially all the components of electronic apparatus including such signal processing means are provided in semiconductor integrated circuit form.

It is therefore an object of the present invention to provide a key input circuit of simple structure suitable to be integrated into semiconductor integrated circuit form.

Another object of the present invention is to provide a key input circuit of semiconductor integrated circuit structure which can reduce the number of input terminals for externally applying key input information signals from a key block to a signal processing system of semiconductor integrated circuit structure and which includes an encoder of simple structure.

The present invention will be fully described with reference to the accompanying drawings showing some preferred embodiments, in which:

FIGS. 3 and 8 show waveforms of pulse signals used in the key input circuit shown in FIG. 1;

FIGS. 6a and 6b show a counter structure and a truth table preferably used in the present invention; and FIGS. 7a, 7b and 7c show another counter structure and truth tables preferably used in the present invention.

Figure 4:
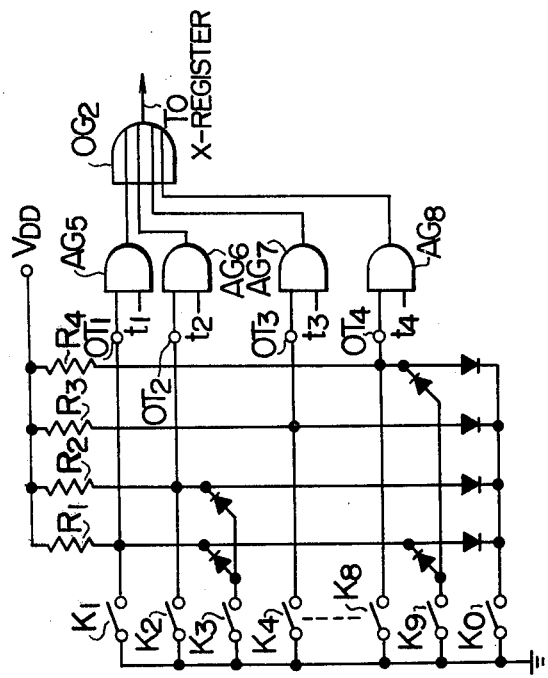
FIGS. 4 and 5 are circuit diagrams of conventional key input circuits.
Figure 5:
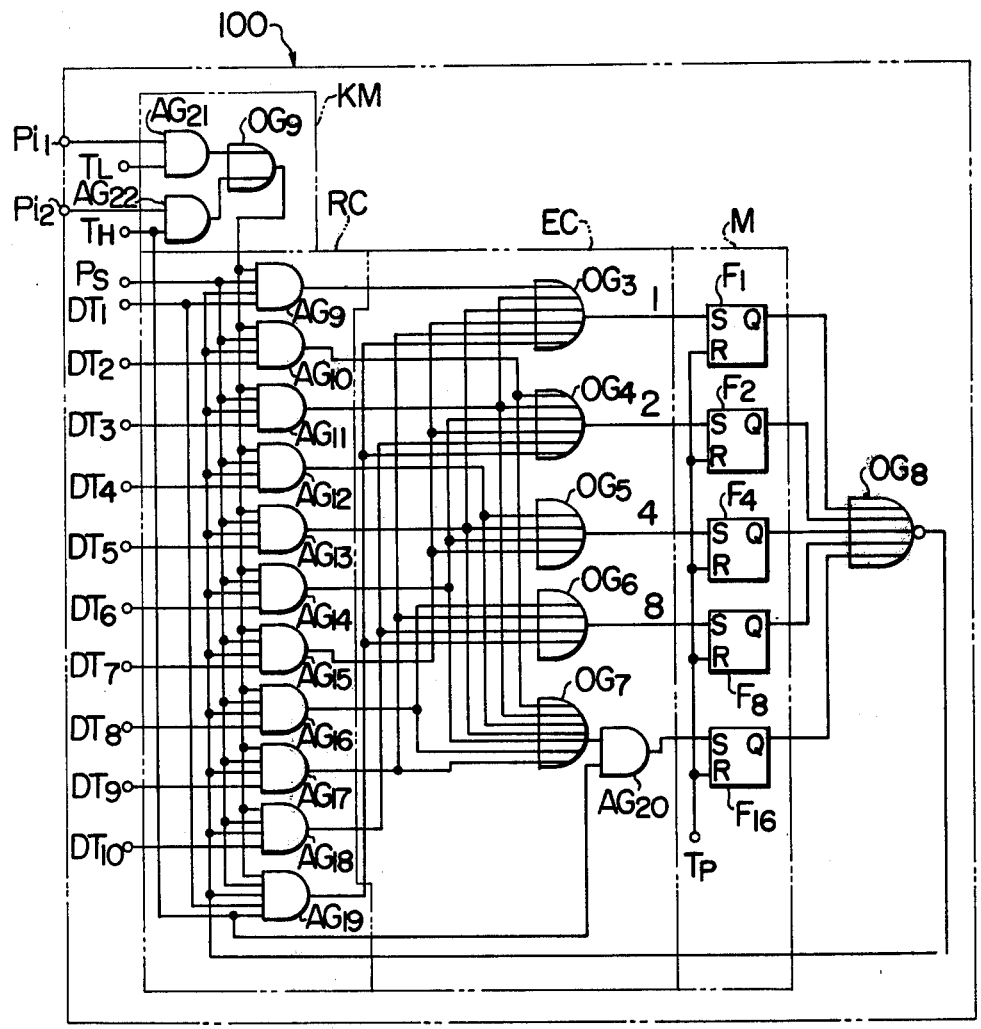

For better understanding of the present invention, reference will first be made to FIGS. 4 and 5 showing examples of the conventional key input circuits.

Referring to FIG. 4, a diode matrix is used for converting outputs of key switches $K_1, K_2, \ldots K_0$ into signal levels having the respective weights of "1", "2", "4" and "8", and these signal levels appear at output terminals $OT_1$, $OT_2$, $OT_3$ and $OT_4$ to be applied to AND gates $AG_5$, $AG_6$, $AG_7$ and $AG_8$ respectively, so that they can be converted into a binary-coded 4-bit pulse signal in response to the application of timing pulses $t_1$, $t_2$, $t_3$ and $t_4$ to the respective AND gates $AG_5$, $AG_6$, $AG_7$ and $AG_8$.

Principal parts of a digital system including means such as memory means, arithmetic means and control means in a desk computer are constructed in semiconductor integrated circuit form. On the other hand, a diode matrix used in a key input circuit as shown in FIG. 4 for converting output signals of key switches $K_1$ to $K_0$ into a binary code, must necessarily be disposed external to the digital system of semiconductor integrated circuit structure due to the limitation of the present technique of making semiconductor integrated circuits. Therefore, the key input circuit shown in FIG. 4 has been defective among others in that many input terminals are required in order that the output signals of the diode matrix disposed external to the digital system of semiconductor integrated circuit structure can be satisfactorily applied to the digital system.

DT-OS No. 2337084 (laid open on Feb. 21, 1974) corresponding to French Pat. No. 7325782 (French Patent Publn. No. 2194327) discloses an improved key input circuit in an attempt to reduce the number of input terminals of a digital system of semiconductor integrated circuit structure connected to a key block.

Hitachi, Ltd. is the assignee of the applications regarding these printed publications. A brief summary of the disclosure of these printed publications will be described with reference to FIG. 5.

Figure 2:
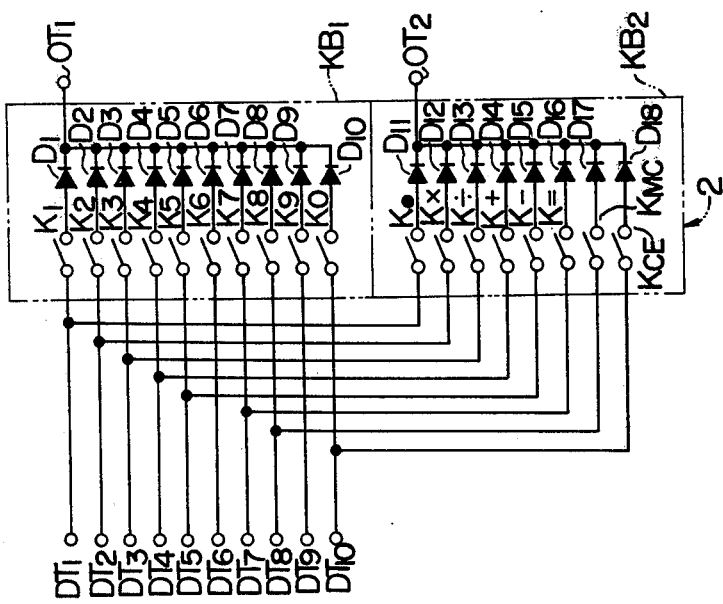
FIG. 2 is a connection diagram of key switches.

Referring to FIG. 5, a digital system of semiconductor integrated circuit structure is designated generally by the reference numeral 100 and is provided with external input terminals $Pi_1$ and $Pi_2$ which are respectively connected to output terminals $OT_1$ and $OT_2$ of an external key switch circuit 2 as shown in FIG. 2. In the key switch circuit 2 shown in FIG. 2, digit pulses $DT_1$ to $DT_{10}$ are applied from timing pulse generating means (not shown) to a numeral key block $KB_1$ and a function key block $KB_2$ which are respectively connected to the output terminals $OT_1$ and $OT_2$. Therefore, the numeral information and function information in the key information group are applied in multiplex relation from the output terminals $OT_1$ and $OT_2$ of the external key switch circuit 2 shown in FIG. 2 to the input terminals $Pi_1$ and $Pi_2$ of the digital system 100 of semiconductor integrated circuit structure shown in FIg. 5 by way of single information transmission lines respectively.

The information signals applied to the external input terminals $Pi_1$ and $Pi_2$ are applied to an OR gate $OG_9$ through respective AND gate $AG_{21}$ and $AG_{22}$ constituting a key signal multiplexer KM, and the output of the OR gate $OG_9$ is applied in common to AND gates $AG_9$ to $AG_{19}$ constituting a key signal read controller RC. The AND gates $AG_{21}$ and $AG_{22}$ are controlled respectively by timing pulses $T_L$ and $T_H$ applied alternately at intervals of one word period. This latter timing pulse $T_H$ is also applied to the AND gate $AG_{19}$ in the key signal read controller RC so as to distinguish between the numeral information and the function information. Digit pulses $DT_1$ to $DT_{10}$ are applied respectively to the AND gates $AG_9$ to $AG_{18}$ in the key signal read controller RC, and the digit pulse $DT_1$ is applied also to the AND gate $AG_{19}$. Further, a start pulse $P_S$ is applied in common to all the AND gates $AG_9$ to $AG_{19}$ so as to prevent an undesirable key manipulation such as double depression of the keys. Further, in order to prevent misapplication of key signals, the output of a NOR gate $OG_8$ is applied in common to all the AND gates $AG_9$ to $AG_{19}$ as a key signal detection input. This NOR gate $OG_8$ is connected at the input terminals thereof to a plurality of flip-flops $F_1, F_2, F_4, F_8$ and $F_{16}$ constituting a memory M.

A plurality of OR gates $OG_3, OG_4, OG_5, OG_6$ and $OG_7$ constitute an encoder EC which encodes input signals into a binary code. These OR gates $OG_3, OG_4, OG_5, OG_6$ and $OG_7$ have respectively the weights "1", "2", "4", "8" and "16".

In response to the manipulation of the key switches, the outputs of the AND gates $AG_9$ to $AG_{19}$ are distributed to the OR gates $OG_3$ to $OG_7$. The outputs of these OR gates $OG_3$ to $OG_7$ are applied respectively to the set input terminal S of the flip-flops $F_1, F_2, F_4, F_8$ and $F_{16}$ constituting the key input information memory. Although the outputs of the OR gates $OG_3$ to $OG_6$ are directly applied to the respective flip-flops $F_1, F_2, F_4$ and $F_8$, the output of the OR gate $OG_7$ is applied to the flip-flop $F_{16}$ through an AND gate $AG_{20}$ controlled by the timing pulse $T_H$ so as to distinguish between the numeral information and the function information.

In operation, suppose, for example, that the numeral key $K_5$ is depressed to apply the digit pulse $DT_5$ to the AND gate $AG_{13}$. An input of "1" level appears from the AND gate $AG_{13}$ in response to the application of the timing pulse $T_L$ of "1" level. This output is applied through the OR gates $OG_5$ and $OG_3$ to set the flip-flops $F_4$ and $F_1$. Thus, a binary-coded pattern "0" "0" "1" "0" "1" appears from the flip-flops $F_{16}, F_8, F_4, F_2$ and $F_1$.

Suppose, further, that the minus key $K-$ is depressed to apply the digit pulse $DT_5$ to the AND gate $AG_{13}$. In this case, an output of "1" level appears similarly from the AND gate $AG_{13}$ in response to the application of the timing pulse $T_L$ of "1" level, and the AND gate $AG_{20}$ is also opened due to the application of the timing pulse $T_H$ of "1" level thereto. Therefore, the output of the AND gate $AG_{13}$ is applied through the OR gates $OG_7$, $OG_5$, $OG_3$ and AND gate $AG_{20}$ to set the flip-flops $F_{16}$, $F_4$ and $F_1$, and a binary-coded pattern "1" "0" "1" "0" "1" appears from the flip-flops $F_{16}, F_8, F_4, F_2$ and $F_1$. Similarly, other binary-coded patterns are obtained in response to the depression of the remaining numeral and function keys.

The key input circuit above described is useful in that many key information inputs can be applied to the information processing circuit in the digital system of semiconductor integrated circuit structure in spite of the fact that the number of key input terminals is reduced. However, such key input circuit has not been suitable for integration into a semiconductor integrated circuit form due to the fact that the key signal read controller and encoder in the digital system of semiconductor integrated circuit structure include many AND and OR gates.

Preferred embodiments of the present invention which eliminates the above disadvantage will be described in detail with reference to FIGS. 1, 3, 6, 7 and 8.

Figure 1:
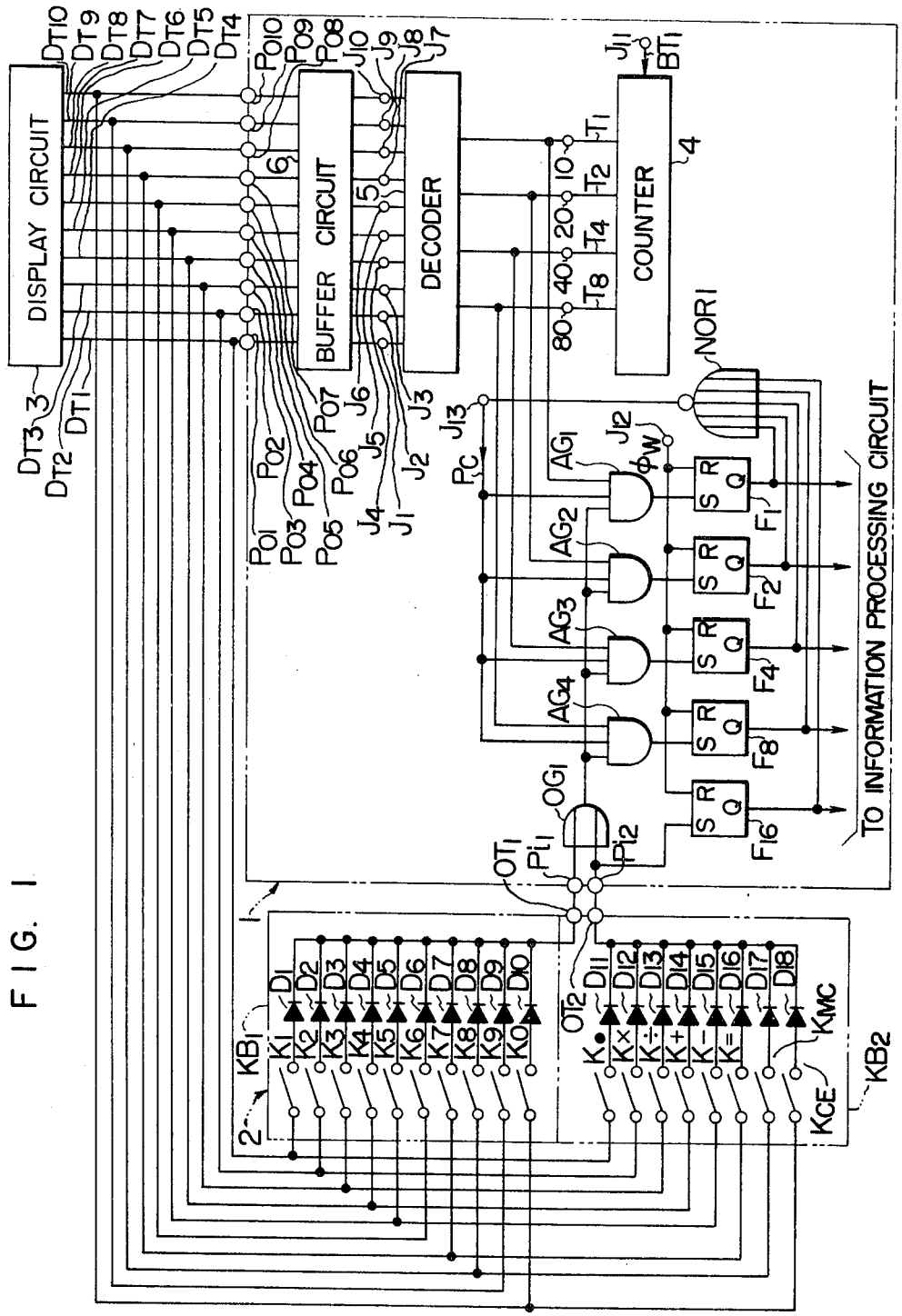
FIG. 1 is a circuit diagram of an embodiment of the key input circuit according to the present invention.

FIG. 1 is a circuit diagram of an embodiment of the key input circuit according to the present invention when applied to a desk computer designed for displaying ten digits. The structure of the key input circuit capable of providing a binary code corresponding to a key input will be described with reference to FIG. 1.

Referring to FIG. 1, the reference numeral 1 designates a digital system portion of semiconductor integrated circuit structure including the key input circuit of the present invention. This system portion 1 includes further various digital circuits (not shown) such as memory means, arithmetic means, control means and timing pulse generating means which are essential elements of a desk computer. These circuits can be easily integrated by, for example, the known MOS IC technique.

Figure 3:
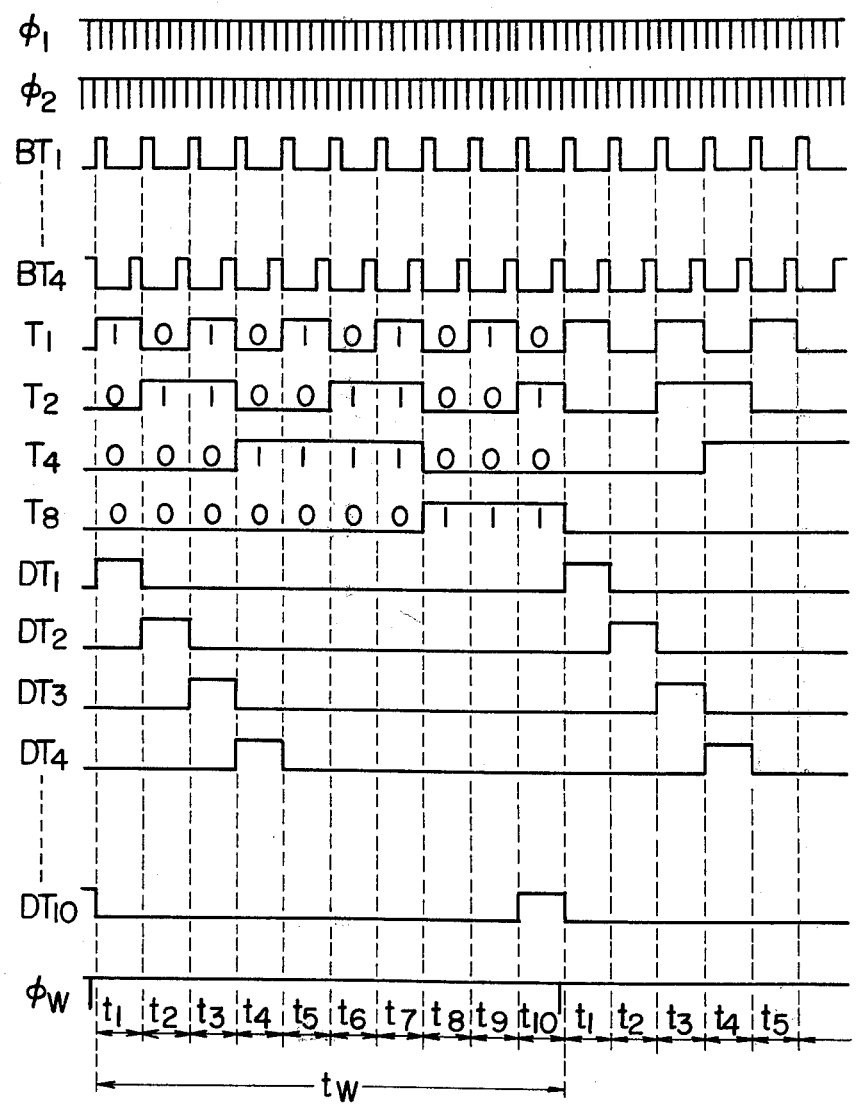

The system portion 1 of semiconductor integrated circuit structure comprises pulse generating means (not shown) for generating timing pulses required for the operation of the desk computer. Clock pulses $\phi_1$ and $\phi_2$, bit timing pulses $BT_1$, $BT_2$ $BT_3$ and $BT_4$ synchronous with these clock pulses, and a word pulse $\phi_w$ are generated by the timing pulse generating means and have waveforms as shown in FIG. 3.

A key switch circuit 2 in FIG. 1 comprises a first key block $KB_1$ including numeral keys $K_1$ to $K_0$ and associated diodes $D_1$ to $D_{10}$ common-connected to a first output terminal $OT_1$, and a second key block $KB_2$ including function keys $K_*$ to $K_{CE}$ and associated diodes $D_{11}$ to $D_{18}$ common-connected to a second output terminal $OT_2$.

A digit counter 4, which may be a binary-coded decimal counter, counts the number of bit timing pulses $BT_1$ applied to its input terminal $J_{11}$, and binary coded decimal outputs "$T_8$", "$T_4$", "$T_2$" and "$T_1$" appear at respective output terminals 80, 40, 20 and 10 of the binary-coded decimal counter 4. That is, the binary-coded decimal outputs appearing at the respective output terminals 10, 20, 40 and 80 of the counter 4 have the weights "1", "2", "4" and "8".

The structure of the counter 4 is naturally dependent upon the number of digits to be displayed on the computer or the number of key information inputs provided by the key switches. The binary-coded decimal counter 4 is used in the present embodiment, since a numeral display circuit 3 designed to be adapted for the dynamic driving system is provided to display ten digits, and the digit signals applied from a buffer circuit 6 to the display circuit 3 are also utilized as timing signals required for the operation of the key input circuit according to the present invention. Needless to say, a binary-coded N-ary counter is required when the computer is designed to display N digits. (The symbol N used in the term "N-ary counter" represents the number of distinct levels in a code.) The structure of the counter 4 is determined by the number of key information inputs provided by the key switches when the key input circuit is designed independently of the display circuit 3. For instance, a binary-coded quarternary counter is required when the number of key switches is four and the key information signals provided by these four key switches are transmitted in multiplex relation by a single transmission line. Generally, a binary-coded N-ary counter is required when the number of key switches is N and the N key information or key switch signals provided by these N key switches are transmitted in multiplex relation by a single transmission line.

It is commonly known that a binary-coded N-ary counter can be obtained by combining a plurality of binary counters with a gate. FIG. 6a shows, by way of example, the structure of the binary-coded decimal counter 4 employed in the key input circuit for displaying ten digits on the display circuit 3. The counter 4 shown in FIG. 6a comprises four binary counters $MSF_1$, $MSF_2$, $MSF_3$ and $MSF_4$ of master/slave type, one delayed flip-flop $DF_1$, and one AND gate $AG_{10}$. This counter counts the information corresponding to "1" to "10" in the decimal notation within the period of one word time $t_w$ as shown at $T_1, T_2, T_4$ and $T_8$ in FIG. 3. For instance, the output signals $T_8, T_4, T_2$ and $T_1$ appearing at the respective output terminals 80, 40, 20 and 10 of the counter 4 at digit times $t_1$ and $t_2$ are "0", "0", "0", "1" and "0", "0", "1", "0" representing respectively "1" and "2" in the decimal notation. Similarly, at digit time $t_{10}$, these output signals are "1", "0", "1", "0" representing "10" in the decimal notation. FIG. 6b shows the truth table for the binary counters MSF$_2$ to MSF$_8$.

In lieu of the bit timing pulse signal BT$_1$, the bit timing pulse signal BT$_4$ may be applied to the counter 4. Further, as shown in a time chart of FIG. 8, the coded outputs T$_8$, T$_4$, T$_2$ and T$_1$ of the counter 4 at the final digit time $t_{10}$ may be "0", "0", "0", "0". FIG. 7a shows a modification of the counter 4, and in this modification, the bit timing pulse signal BT$_4$ is applied in lieu of BT$_1$. This modified counter 4 operates according to the time chart shown in FIG. 8. FIGS. 7b and 7c show the truth table for the binary counters MSF$_{20}$ and MSF$_{80}$, and that for the binary counters MSF$_{10}$ and MSF$_{40}$.

Referring to FIG. 1 again, a decoder 5 decodes the coded outputs T$_1$, T$_2$, T$_4$ and T$_8$ of the digit counter 4 to convert the same into a plurality of timing pulses. More precisely, this decoder 5 converts the binary-coded output signals of the counter 4 into the corresponding decimal number. For example, the decoder 5 decodes the counter outputs T$_8$, T$_4$, T$_2$ and T$_1$ appearing at digit time $t_1$ in FIG. 3 and representing "0", "0", "0", "1", and a digit timing pulse signal DT$_1$ appears at an output terminal J$_1$ of the decoder 5. Similarly, digit timing pulse signals DT$_2$ to DT$_{10}$ appear at output terminals J$_2$ to J$_{10}$ of the decoder 5 at digit times $t_2$ to $t_{10}$ respectively.

The outputs of the decoder 5 are amplified by the buffer circuit 6. The amplified outputs appearing at external output terminals P$_{o1}$ to P$_{o10}$ of the buffer circuit 6 are applied as digit signals DT$_1$ to DT$_{10}$ to the numeral display circuit 3 disposed external to the digital system portion 1 of semiconductor integrated circuit structure so as to make display circuit 3 operate dynamically.

As described previously, the digit counter 4 is a decimal counter, and the bit timing pulse signal BT$_1$ among the bit timing pulse signals BT$_1$ to BT$_4$ obtained by sampling the clock pulses $\Phi_1$ and $\Phi_2$ shown in FIG. 3 are applied to this digit counter 4. Therefore, the pulse signal outputs T$_1$ to T$_8$ of the digit counter 4 have waveforms as shown in FIG. 3, and these outputs are decoded by the decoder 5 to provide the timing pulse signals DT$_1$ to DT$_{10}$ which are applied as the digit signals to the display circuit 3.

In the present invention, the pulse signal outputs T$_1$, T$_2$, T$_4$ and T$_8$ of the digit counter 4 are also respectively applied through the AND gates AG$_1$, AG$_2$, AG$_3$ and AG$_4$ to the set terminal S of the flip-flops F$_1$, F$_2$, F$_4$ and F$_8$ which function as a key information memory, and the AND gates AG$_1$ to AG$_4$ are controlled in a manner as described below so as to obtain a binary code corresponding to a specific key input.

Referring to FIG. 1, the external output terminals P$_{o1}$ to P$_{o10}$ of the buffer circuit 6 in the digital system portion 1 of semiconductor integrated circuit structure are connected respectively to the numeral keys K$_1$ to K$_0$ of the key block KB$_1$ in the key switch circuit 2, and the external output terminals P$_{o1}$, P$_{o2}$, P$_{o3}$, P$_{o4}$, P$_{o5}$, P$_{o7}$, P$_{o8}$ and P$_{o10}$ are connected respectively to the function keys K. to K$_{CE}$ of the key block KB$_2$ in the key switch circuit 2, so that the corresponding digit signals can be applied to these keys. The numeral keys K$_1$ to K$_0$ are connected through the respective diodes D$_1$ to D$_{10}$ to the common output terminal OT$_1$ so as to apply the digit signals D$_1$ to D$_{10}$ appearing at this common output terminal OT$_1$ to the digital system portion 1 of semiconductor integrated circuit structure through the external input terminal P$i_1$. Similarly, the function keys K. to K$_{CE}$ are connected through the respective diodes D$_{11}$ to D$_{18}$ to the common output terminal OT$_2$ so as to apply the digit signals DT$_1$ to DT$_5$, DT$_7$, DT$_8$ and DT$_{10}$ appearing at this common output terminal OT$_2$ to the digital system portion 1 through the external input terminal P$i_2$. The key input signals are applied through the external input terminals P$i_1$ and P$i_2$ to an OR gate OG$_1$ to provide timing pulses for controlling the AND gates AG$_1$ to AG$_4$. Further, the signal applied through the external input terminal P$i_2$ is also applied to the set input terminal S of the flip-flop F$_{16}$ so as to distinguish between the numeral key input and the function key input.

The diodes D$_1$ to D$_{18}$ are provided in the key switch circuit 2 for preventing undesirable disappearance of the numerals displayed on the display circuit 3 due to multiple depression of the keys. That is, these diodes are provided to eliminate mutual interference of the keys. A key signal read control signal Pc is applied from a terminal J$_{13}$ in common to all the AND gates AG$_1$ to AG$_4$ so as to prevent double reading of the key signals, malreading due to multiple depression of the keys and reading of the key signals during computation. This control signal Pc is obtained, for example, by applying the outputs of the flip-flops F$_1$ to F$_{16}$ to a NOR gate NOR$_1$ connected to the terminal J$_{13}$. The timing pulse $\Phi_w$ shown in FIG. 3 is applied through a terminal J$_{12}$ to the reset input terminal R of the flip-flops F$_1$ to F$_{16}$ which function as a key information memory. This timing pulse $\Phi_w$ is given by the following logical expression (1):

$$\Phi_w = \frac{}{\overline{\Phi_1} \cdot BT_4 \cdot DT_{10}} \qquad (1)$$

It will be readily understood from the foregoing description that the key input circuit according to the present invention operates in a manner as described below to attain the desired object.

In operation, suppose, for example, that the numeral key K$_1$ is depressed so that the key signal provided thereby can be binary coded. At digit time $t_1$, the coded outputs T$_8$, T$_4$, T$_2$ and T$_1$ of the digit counter 4 are represented by "0", "0", "0", "1", and this binary code is decoded by the decoder 5 to provide the digit signal DT$_1$. This digit signal DT$_1$ is applied through the numeral key K$_1$, terminals OT$_1$, P$i_1$ and OR gate OG$_1$ to the AND gates AG$_1$ to AG$_4$, with the result that these AND gates AG$_1$ to AG$_4$ are opened with this timing. Therefore, the coded outputs T$_8$ to T$_1$ of the digit counter 4 appearing at this time are applied to the flip-flops F$_8$ to F$_1$ respectively. The flip-flop F$_{16}$ is in the state "0" since the digit signal DT$_1$ is not applied thereto. Thus, the Q outputs of the flip-flops F$_1$ to F$_{16}$ appearing in response to the depression of the numeral key K$_1$ are represented by "0", "0", "0", "0", "1", and this binary code is transmitted to the information processing circuit (not shown) as information representing "1" in the decimal notation.

Similarly, depression of the numeral keys K$_2$ to K$_0$ acts to open the AND gates AG$_1$ to AG$_4$ with the timing of the respective digit signals DT$_2$ to DT$_{10}$, and binary-coded signals given respectively by "0", "0", "0", "1", "0" to "0", "1", "0", "1", "0" are applied to the flip-flops $F_{16}$ to $F_1$ functioning as the key information memory.

When the function key $K.$ (indicating the decimal point) is depressed, the same signals as those appeared in response to the depression of the numeral key $K_1$ are applied to the flip-flops $F_8$ to $F_1$, but in this case, the flip-flop $F_{16}$ is placed in the state "1" by the input applied through the terminals $OT_2$ and $Pi_2$. Therefore, the binary code "1", "0", "0", "0", "1" is obtained in this case and differs from that obtained in response to the depression of the numeral key $K_1$.

The binary-coded outputs appearing in response to the depression of the individual keys are tabulated in the following table:

Table

| Key | Timing signal | Output | Key information |
|---|---|---|---|
| $K_1$ | $DT_1$ | 00001 | 1 |
| $K_2$ | $DT_2$ | 00010 | 2 |
| $K_3$ | $DT_3$ | 00011 | 3 |
| $K_4$ | $DT_4$ | 00100 | 4 |
| $K_5$ | $DT_5$ | 00101 | 5 |
| $K_6$ | $DT_6$ | 00110 | 6 |
| $K_7$ | $DT_7$ | 00111 | 7 |
| $K_8$ | $DT_8$ | 01000 | 8 |
| $K_9$ | $DT_9$ | 01001 | 9 |
| $K_0$ | $DT_{10}$ | 01010 | 0 |
| $K.$ | $DT_1$ | 10001 | Decimal point |
| $K_\times$ | $DT_2$ | 10010 | Multiplication |
| $K_\div$ | $DT_3$ | 10011 | Division |
| $K_+$ | $DT_4$ | 10100 | Addition |
| $K_-$ | $DT_5$ | 10101 | Subtraction |
| $K_=$ | $DT_7$ | 10111 | Computation start |
| $K_{MC}$ | $DT_8$ | 11000 | Memory clear |
| $K_{CE}$ | $DT_{10}$ | 11010 | Clear entry |

When one of the key signals is stored in any one of the flip-flops $F_1$ to $F_{16}$, the output of the NOR gate $NOR_1$ appearing at the terminal $J_{13}$ is immediately changed to the "0" level, and the AND gates $AG_1$ to $AG_4$ are closed to prevent the other key signals from being applied to the flip-flops $F_1$ to $F_{16}$.

It will be understood from the foregoing detailed description that the present invention eliminates the prior art necessity for provision of an encoder such as a diode matrix of complex structure for the binary coding of key inputs, and an encoder of simple structure consisting of a small number of logical gates is incorporated in a digital system portion of semiconductor integrated circuit structure. Therefore, the key input circuit according to the present invention can be greatly simplified in structure. Further, the key input circuit according to the present invention requires less input terminals than hitherto due to the fact that the key input signals to be provided from one key block are transmitted to the key input circuit by only one single transmission line.

The present invention is in no way limited to specific embodiments as above described, and various other changes and modifications may be made therein without departing from the spirit of the present invention.

For example, the flip-flops shown in FIG. 1 may be dispensed with depending on the manner of control of a digital system to which the present invention may be applied, and the outputs of the AND gates $AG_1$ to $AG_4$ may be applied directly to various registers in the information processing circuit, because these flip-flops act merely as a temporary memory for key inputs. Further, although key input signals are classified into a numeral information group and a function information group for the purpose of multiplex transmission of the key input signals in the embodiments above described, they may not be classified into two groups depending on the number of digit signals, or they may be classified into three or four groups. It is to be noted, however, that classification of the key input signals into three or four groups above described results in the corresponding increase in the number of external input terminals.

The key input circuit according to the present invention is widely applicable to various kinds of digital apparatus adapted to be applied with a plurality of information inputs produced by manipulation of keys, in addition to the application to desk computers. In such a case, the decoder and the N-ary counter required for the operation of the key input circuit may be suitably replaced by decoders and counters provided for the operation of the digital apparatus.

What we claim is:

1. A key input circuit associated with a key switch board for coding a plurality of key information inputs to an information processing system into electrical signals comprising:
   a. binary-coded N-ary counter means for delivering binary-coded output signals representing N distinct code levels;
   b. decoder means connected to the output terminals of said binary-coded N-ary counter means for converting the binary-coded output signals appearing at the output terminals of said binary-coded N-ary counter means into N timing pulse signals;
   c. a plurality of key switches corresponding respectively to a plurality of key information inputs;
   d. key switch circuit means, having a plurality of input terminals connecting the output terminals of said decoder means to one side of said key switches, respectively, and an output terminal connected in common to the other side of said key switches for delivering one of said timing signals in response to the turn-on of a selected one of said key switches by key manipulation; and
   e. gate circuit means having a plurality of output terminals, a plurality of first input terminals connected to the output of said binary-coded N-ary counter means and a plurality of second input terminals connected to the output terminal of said key switch circuit means for applying one of said binary-coded output signals periodically and successively received from said counter means to said output terminals in response to receipt of one of said timing pulse signals.

2. A key input circuit as claimed in claim 1, wherein said gate circuit means comprises a plurality of AND gates each having a first input terminal, a second input terminal and an output terminal, said AND gates receiving the respective output signals of said binary-coded N-ary counter means at said first input terminals thereof and having said second input terminals thereof connected in common to the output terminal of said key switch circuit means, whereby the outputs appearing at the output terminals of said AND gates provide the specific key information signal.

3. A key input circuit as claimed in claim 2, wherein said gate circuit means is associated with a plurality of memory means each storing the output of the corresponding one of said AND gates.

4. A key input circuit as claimed in claim 1, wherein the output terminal of said key switch circuit means is connected to the second input terminals of said gate circuit means by a single signal transmission line.

5. A key input circuit as claimed in claim 1, wherein said key switch circuit means has two output terminals.

6. A key input circuit as claimed in claim 5, wherein said key switch circuit means and said gate circuit means are connected through an OR gate having two input terminals connected respectively to said two output terminals of said key switch circuit means.

7. A key input circuit as claimed in claim 6, wherein said gate circuit means is associated with memory means for storing said timing pulse signal appearing at one of said output terminals of said key switch circuit means.

8. A key input circuit as claimed in claim 2, wherein said AND gates are each provided with a third input terminal, and means responsive to the outputs of said gate circuit means for applying a second timing pulse signal to said third input terminals.

9. A key input circuit for coding a plurality of key information inputs to electrical signals for application to an information processing system, comprising:
   binary-coded N-ary counter means for producing N combinations of binary-coded signals by counting a first timing pulse signal applied to said counter means;
   decoder means for converting each one of said binary-coded signals from said binary-coded N-ary counter means into N second timing pulse signals;
   key switch circuit means having a plurality of input terminals connected to receive the respective outputs of said decoder means and at least one output terminal and including a plurality of key switches corresponding respectively to a plurality of key information inputs, one end of said key switches being connected with different ones of said input terminals of said key switch circuit means and the other ends of said key switches being connected with said one output terminal of said key switch circuit means, the number of said output terminals being smaller than that of said input terminals;
   gate circuit means having first input terminals connected to receive the outputs of said binary-coded N-ary counter means and second input terminals connected in common to receive one of said N second timing pulse signals associated with an operated one of said key switches; and
   means for connecting said output terminal of said key switch circuit means with said second input terminals of said gate circuit means.

10. A key input circuit as claimed in claim 9, wherein said gate circuit means comprises a plurality of AND gates each having a first input terminal, a second input terminal and an output terminal, said first input terminals of said AND gates being connected to receive different ones of the bits of said binary-coded signals from said counter means.

11. A key input circuit as claimed in claim 9, wherein said key switches are grouped in blocks, said other ends of the key switches in each block being connected in common with one end of a common-connection line, the other end of said common-connection line being connected with a respective one of a plurality of output terminals of said key switch circuit means.

12. A key input circuit as claimed in claim 10, wherein said key switch circuit means has two output terminals.

13. A key input circuit as claimed in claim 12, wherein said key switch circuit means and said gate circuit means are connected through an OR gate having two input terminals connected respectively to said two output terminals of said key switch circuit means.

14. A key input circuit as claimed in claim 13, wherein the key input circuit further comprises memory means and said gate circuit means is associated with said memory means for storing one of said N second timing pulse signals which appear at said output terminals of said key switch circuit means.

15. A key input circuit as claimed in claim 14, wherein the key input circuit further includes means connected with the output of said memory means for producing a third timing pulse signal, and said AND gates are each provided with a third input terminal for receiving said third timing pulse signal in common.

* * * * *